(12) United States Patent
Price, Jr.

(10) Patent No.: US 6,636,082 B1
(45) Date of Patent: Oct. 21, 2003

(54) SYSTEM AND METHOD FOR DETECTING A NEGATIVE SUPPLY FAULT

(75) Inventor: John J. Price, Jr., Edina, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/123,645

(22) Filed: Apr. 16, 2002

(51) Int. Cl.[7] .................... H03K 5/153; H03K 5/22
(52) U.S. Cl. .................... 327/77; 327/78; 327/81
(58) Field of Search .................... 327/60, 62, 68, 327/70, 72, 73, 77, 78, 79, 80, 81, 88, 89, 205; 361/92, 93.1, 93.7

(56) References Cited

U.S. PATENT DOCUMENTS 5,638,029 A * 6/1997 O'Shaughnessy ............ 331/44
6,008,674 A * 12/1999 Wada et al. .................. 327/89
6,278,327 B1 * 8/2001 Curd et al. .................. 330/297
6,329,795 B1 * 12/2001 Nakashimo .................. 320/134
6,448,823 B1 * 9/2002 Shokouhi et al. ............. 327/68

* cited by examiner

Primary Examiner—Tuan T. Lam
(74) Attorney, Agent, or Firm—W. Daniel Swayze, Jr.; W. James Brady; Frederick J. Telecky, Jr.

(57) ABSTRACT

A negative supply, low-voltage supply fault detection circuit is implemented without the need for a current mirror thereby providing for the elimination of inaccuracies generally associated with a current mirror, and resulting in less power consumption when compared with known negative supply, low-voltage detection circuits that employ a current mirror and associated support circuitry.

7 Claims, 3 Drawing Sheets

SYSTEM AND METHOD FOR DETECTING A NEGATIVE SUPPLY FAULT

BACKGROUND OF THE INVENTION

1. Field of the Invention

This invention relates generally to negative supply, low-voltage detection circuits, and more particularly, to a system and method for detecting a negative supply, low-voltage supply fault without the need for a current mirror.

2. Description of the Prior Art

Modern negative supply ($V_{EE}$), low-voltage detection circuits such as the detection circuit 100 illustrated in FIG. 1, generally employ a current mirror (depicted as Q15, Q16 and Q24) that takes the current in a resistor string 102 to $V_{EE}$, and then supplies this current to a plurality of detection resistors such as resistors R42–R44 illustrated in FIG. 1 as if coming from a positive supply. With continued reference to FIG. 1, the voltage generated via the detection resistors R42–R44 is then compared to a reference voltage such as that applied at the base of transistor Q5. This process requires generating a pseudo ground reference using transistors such as Q17 and Q18 along with a bipolar PNP or a PMOS transistor current mirror such as Q15, Q16 and Q24, all of which occupy area, consume power, and introduce unwanted errors. Those skilled in the art will readily appreciate that PMOS and PNP mirrors are notorious for their inaccuracies if sophisticated techniques are not employed to reduce the unwanted errors. The negative supply, low-voltage detection circuit 100 utilizes an additional 80 $\mu$A of current to bias on transistor Q17; and the current from the $V_{EE}$ resistor string 102 sets up a nominal 100 $\mu$A of current which spans the full supply from $V_{EE}$ to $V_{CC}$ (typically –5V to +5V), and is mirrored again back to Ground.

In view of the foregoing, it would be desirable and advantageous to provide a technique capable of detecting a negative supply, low-voltage supply fault and that does not require a current mirror.

SUMMARY OF THE INVENTION

The present invention is directed to a system and method for detecting a negative supply, low-voltage supply fault without the need for a current mirror.

In one aspect of the invention, a negative supply, low-voltage detection circuit is is implemented to detect a negative supply, low-voltage supply fault without the inaccuracies generally associated with a current mirror.

In another aspect of the invention, a negative supply, low-voltage detection circuit is implemented to consume less power than known negative supply, low-voltage detection circuits that employ a current mirror.

In yet another aspect of the invention, a negative supply, low-voltage detection circuit is implemented without a current mirror and its associated support circuitry.

One embodiment of the invention is directed to a circuit for detecting a negative supply, low-voltage fault comprising a negative supply voltage, a circuit Ground, a circuit configured to generate a reference voltage, a resistor string coupling the negative supply voltage to the reference voltage and having a tap configured to provide a tap voltage that will be at a ground level voltage defined by the circuit Ground when the negative supply voltage reaches a desired threshold level, and a circuit configured to compare the tap voltage and the ground level voltage and generate an output signal when the negative supply voltage reaches the desired threshold level.

Another embodiment of the invention is directed to a circuit for detecting a negative supply, low-voltage fault comprising a negative supply voltage, a circuit Ground, means for generating a reference voltage, a resistor string coupling the negative supply voltage to the reference voltage and having a resistor tap that will be at a ground level voltage defined by the circuit Ground when the negative supply voltage reaches a desired threshold level, and means for comparing the resistor tap voltage with the ground level voltage to generate an output signal when the negative supply voltage reaches the desired threshold level.

Still another embodiment of the invention is directed to a method of detecting a negative supply fault comprising the steps of providing a negative supply, low-voltage detection circuit devoid of current mirrors and having a negative supply voltage, a circuit Ground, means for generating a reference voltage, a resistor string coupling the negative supply voltage to the reference voltage and having a resistor tap that will be at a ground level voltage defined by the circuit Ground when the negative supply voltage reaches a desired threshold level, and a comparator; comparing the resistor tap voltage with the ground level voltage; and generating an output signal when the negative supply voltage reaches the desired threshold level.

BRIEF DESCRIPTION OF THE DRAWINGS

Other aspects, features and advantages of the present invention will be readily appreciated, as the invention becomes better understood by reference to the following detailed description, when considered in connection with the accompanying drawing figure wherein.

While the above-identified drawing figure sets forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
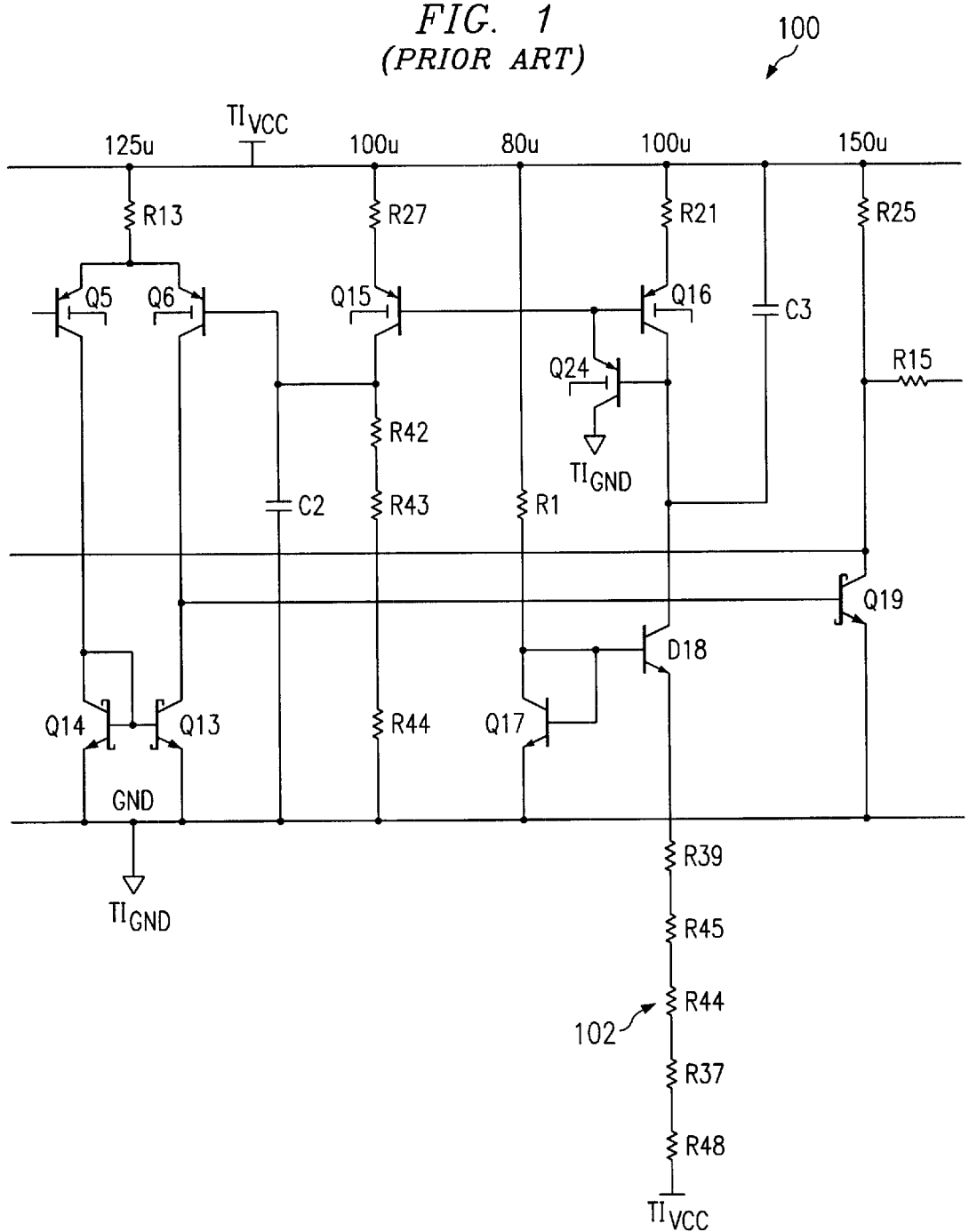
FIG. 1 is a schematic diagram illustrating a prior art negative supply, low-voltage detection circuit.

The brief background discussed herein before regarding negative supply, low-voltage detection circuits is again first set forth below to better clarify and facilitate an understanding of the particular embodiments of the present invention. As stated herein before, modern negative supply ($V_{EE}$), low-voltage detection circuits such as the detection circuit 100 illustrated in FIG. 1, generally employ a current mirror (depicted as Q15, Q16 and Q24) that takes the current in a resistor string 102 to $V_{EE}$, and then supplies this current to a plurality of detection resistors such as resistors R42–R44 illustrated in FIG. 1 as if coming from a positive supply. With continued reference to FIG. 1, the voltage generated via the detection resistors R42–R44 is then compared to a reference voltage such as that applied at the base of transistor Q5. This process requires generating a pseudo ground reference using transistors such as Q17 and Q18 along with a bipolar PNP or a PMOS transistor current mirror such as Q15, Q16 and Q24, all of which occupy area, consume power, and introduce unwanted errors. Those skilled in the art will readily appreciate that PMOS and PNP mirrors are notorious for their inaccuracies if sophisticated techniques are not employed to reduce the unwanted errors. The negative supply, low-voltage detection circuit 100 utilizes an additional 80 μA of current to bias on transistor Q17; and the current from the $V_{EE}$ resistor string 102 sets up a nominal 100 μA of current which spans the full supply from $V_{EE}$ to $V_{CC}$ (typically −5V to +5V), and is mirrored again back to Ground.

Figure 2A:
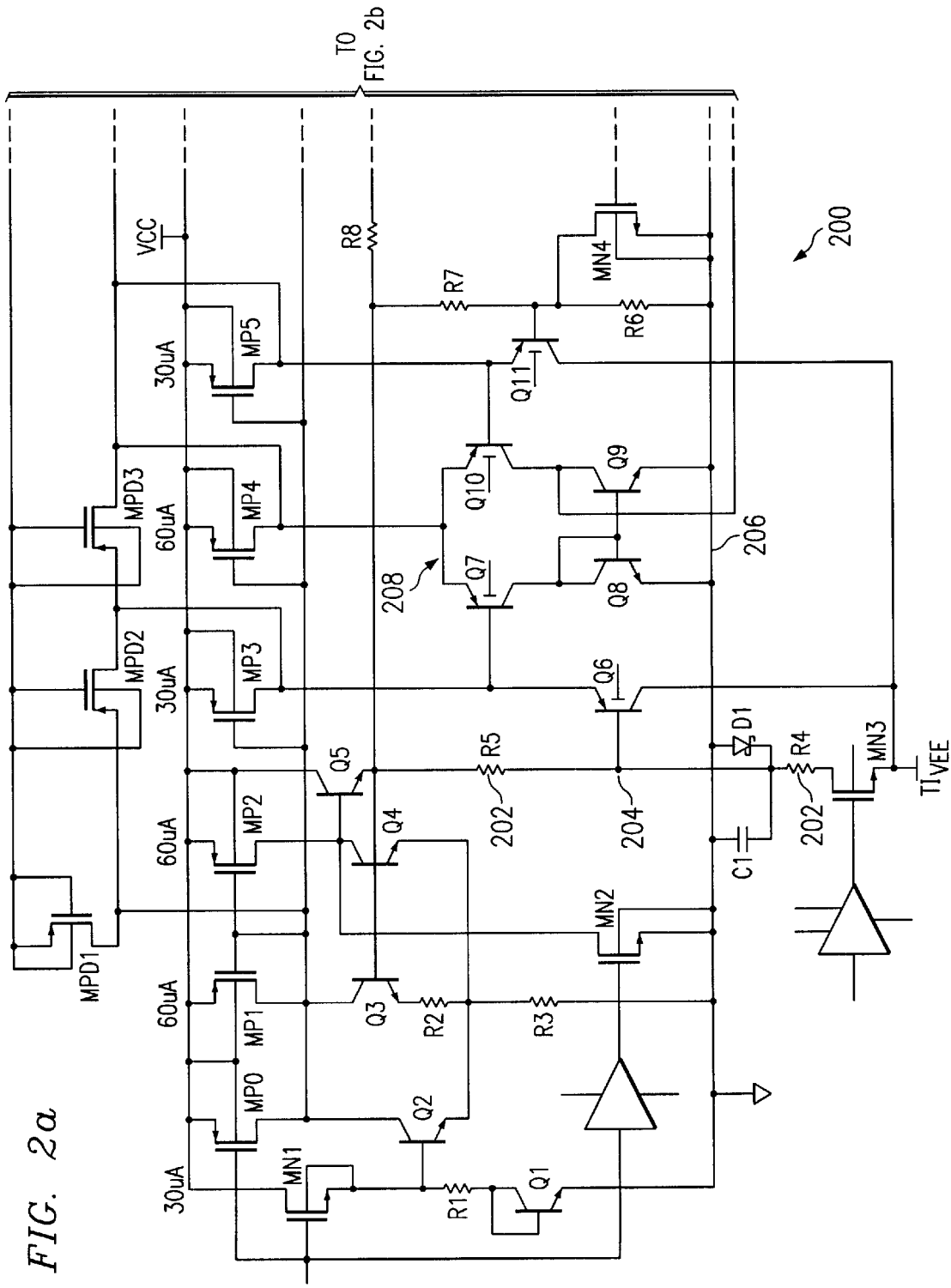
FIGS. 2*a* and 2*b* depict a schematic diagram illustrating a negative supply, low-voltage detection circuit according to one embodiment of the present invention.
Figure 2B:
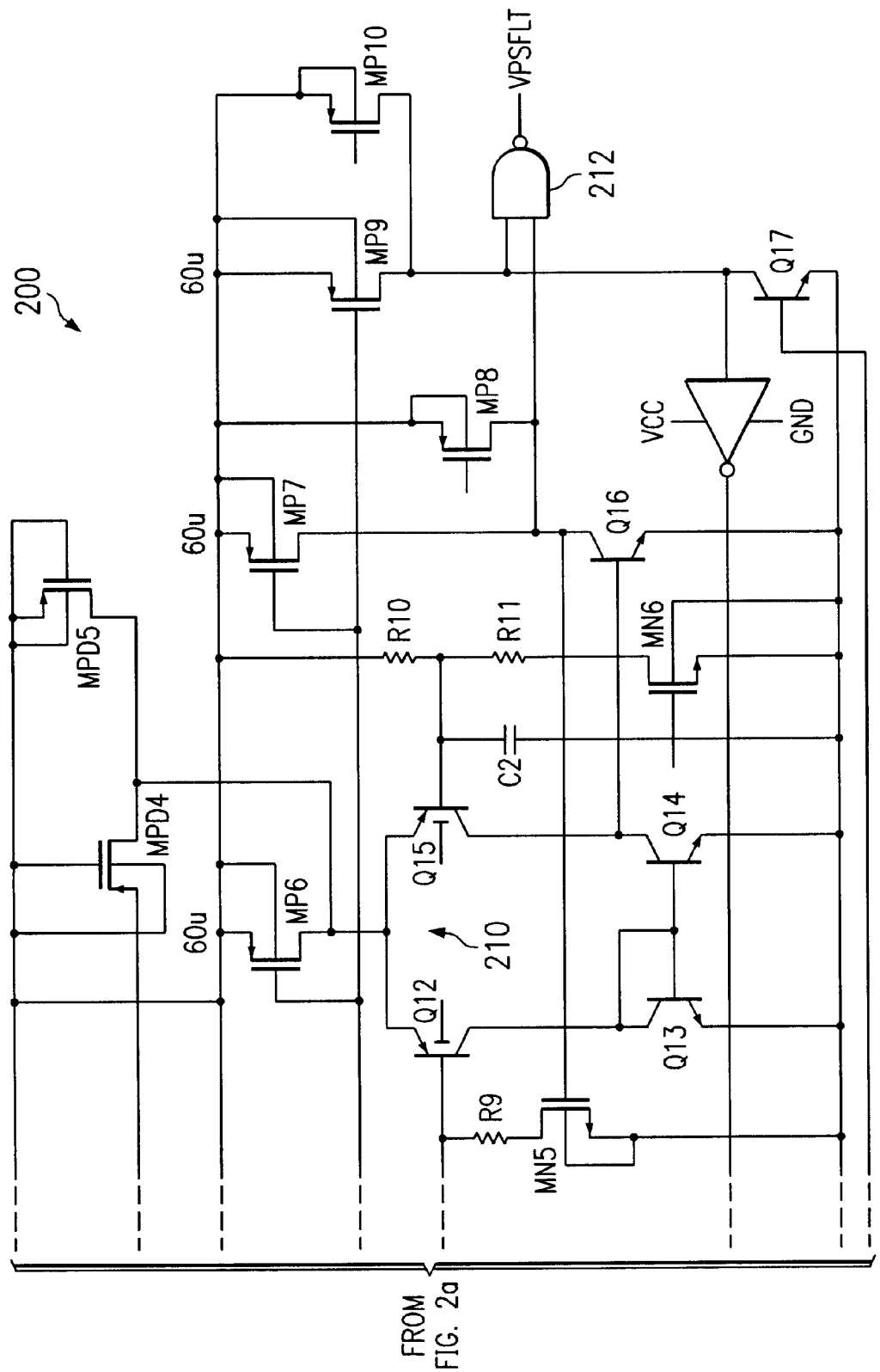

Looking now at FIGS. 2a and 2b, a schematic diagram illustrates a negative supply, low-voltage fault detection circuit 200 according to one embodiment of the present invention. In contradistinction with the negative supply, low-voltage detection circuit shown in FIG. 1, detection circuit 200 can be seen to connect the resistor string 202 from $V_{EE}$ not to a pseudo ground, but instead to a reference voltage (typically about 1.2V) at the emitter of transistor Q5. The resistor string 202 has a tap 204 that will be at Ground 206 when the negative supply voltage $V_{EE}$ is at the detection threshold; so the comparator 208 is ground referenced (at the base of transistor Q11). Resistors R6 and R7 and MOSFET MN4 are used to adjust the ground threshold above Ground to provide hysteresis. It can be seen therefore, no additional power is dissipated when using this scheme, other than the current in the resistor string 202 connected between the negative supply $V_{EE}$ and the reference voltage at the emitter of transistor Q5. The accuracy of detection circuit 200 is therefore much improved over that provided by detection circuit 100, especially due to the absence of a PNP or PMOS current mirror.

Operation of the negative supply, low-voltage fault detection circuit 200 is now set forth in greater detail to provide those skilled in the low-supply detection art with the information needed to apply the novel principles and to construct and use such specialized components as are required. The 1.2V reference is generated by a simple bandgap reference at the emitter of transistor Q5. Everything to the left of transistor Q5 is associated with the bandgap reference and its startup. Transistors Q6, Q7 Q10 and Q11 provide the inputs to the $V_{EE}$ detection comparator 208. The PNP inputs provided by transistors Q6 and Q11 are necessary to allow a comparison around Ground level. The output of the comparator 208 is at the collector of transistor Q9; and is high for $V_{EE}$ vault as indicated in FIG. 2a, which means if $V_{EE}$ is higher than about −2.1V (such as 2.0V), this output will be high. The resistor string for $V_{CC}$ includes resistors R10 and R11, illustrated in FIG. 2b; and the associated comparator 210 is then shown with input devices Q12 and Q15. MOSFET devices (e.g. MN3 and MN6) shown in FIGS. 2a and 2b respectively, are use to shut down the current flow in this cell when in "sleep mode". These devices can be viewed simply as shorts during normal operation. The two comparator 208, 210 outputs are inverted using transistors Q7 and Q16 respectively. These inverted outputs are then combined in an OR function 212 to the output, VPSFLT. The individual fault signals feed back to resistor dividers at the reference side of the comparators 208, 210 to create hysteresis.

If $V_{EE}$ is running normally, at −3V for example (or −5V for a part that uses $V_{EE}$=5V), and the supply collapses to −2V, the $V_{EE}$ comparator 208 switches, taking the VPSFLT output high, and the threshold shifts to −2.3V when the supply reaches about −2.1V (the nominal detection threshold). In this way, the comparator 208 does not chatter if the negative supply voltage is sitting at the threshold. When $V_{EE}$ expands back toward its nominal value, the comparator 208 will switch again when it reaches −2.3V, output VPSFLT returns low, and the hysteresis returns the $V_{EE}$ detection threshold to −2.1V. A similar analysis follows for the positive supply $V_{CC}$. Capacitors C1 and C2 at the tap points of the resistor dividers serve to low-pass filter the associated supply noise to prevent faults when the supply may have a quick excursion beyond the threshold. The present inventor has found the addition of capacitors C1 and C2 to be most preferable, since the supplies are seriously impacted when a writer is operating.

In summary explanation, a negative supply, low-voltage supply fault detection circuit is implemented without the need for a current mirror thereby providing for the elimination of inaccuracies generally associated with a current mirror, and resulting in less power consumption when compared with known negative supply, low-voltage detection circuits that employ a current mirror and associated support circuitry.

In view of the above, it can be seen the present invention presents a significant advancement in the art of negative supply, low-voltage fault detection. In view of the foregoing descriptions, it should be apparent that the present invention also represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, the GND threshold has been described for detecting a supply fault. The present invention is not so limited however, and it shall be understood that any voltage below the reference voltage could be used as a threshold.

What is claimed is:

1. A circuit for detecting a negative supply, low-voltage fault comprising:
   a negative supply voltage;
   a circuit configured to generate a reference voltage;
   a resistor string coupling the negative supply voltage to the reference voltage and having a tap configured to provide a tap voltage that will be at a detection threshold voltage when the negative supply voltage reaches a threshold level;
   a circuit configured to compare the tap voltage and the detection threshold voltage and generate an output signal when the negative supply voltage reaches the threshold level; and
   a circuit configured to adjust the threshold level to provide a hysteresis.

2. The circuit for detecting a negative supply, low-voltage fault according to claim 1 wherein the circuit for detecting a negative supply, low-voltage fault is devoid of current mirrors.

3. The circuit for detecting a negative supply, low-voltage fault according to claim 1 wherein the detection threshold voltage is Ground.

4. A circuit for detecting a negative supply, low-voltage fault comprising:
   a negative supply voltage;
   means for generating a reference voltage;
   a resistor string coupling the negative supply voltage to the reference voltage and having a resistor tap that will be at a detection threshold voltage when the negative supply voltage reaches a threshold level;
   means for comparing the resistor tap voltage with the detection threshold voltage to generate an output signal when the negative supply voltage reaches the threshold level; and means for adjusting the threshold level to provide a hysteresis.

5. The circuit for detecting a negative supply, low-voltage fault according to claim 4 wherein the circuit for detecting a negative supply, low-voltage fault is devoid of current mirrors.

6. The circuit for detecting a negative supply, low-voltage fault according to claim 5 wherein the detection threshold voltage is Ground.

7. A method of detecting a negative supply fault comprising the steps of:

providing a negative supply, low-voltage detection circuit devoid of current mirrors and having a negative supply voltage, means for generating a reference voltage, a resistor string coupling the negative supply voltage to the reference voltage and having a resistor tap that will be at a detection threshold voltage when the negative supply voltage reaches a threshold level, and a comparator;

comparing the resistor tap voltage with the detection threshold voltage;

generating an output signal when the negative supply voltage reaches the threshold level; and adjusting the threshold level to achieve a hysteresis effect.

* * * * *